United States Patent
Shindo et al.

(10) Patent No.: US 6,645,395 B2
(45) Date of Patent: Nov. 11, 2003

(54) PIEZOELECTRIC MATERIAL AND MANUFACTURING METHOD THEREOF

(75) Inventors: Hitoshi Shindo, Nishio (JP); Atsuhiro Sumita, Nishio (JP); Eturo Yasuda, Nishio (JP); Takashi Yamamoto, Chiryu (JP)

(73) Assignees: Denso Corporation (JP); Nippon Soken, Inc. (JP)

( * ) Notice: Subject to any disclaimer, the term of this patent is extended or adjusted under 35 U.S.C. 154(b) by 0 days.

(21) Appl. No.: 09/852,297

(22) Filed: May 10, 2001

(65) Prior Publication Data

US 2002/0027215 A1 Mar. 7, 2002

(30) Foreign Application Priority Data

May 11, 2000 (JP) .......................... 2000-138529

(51) Int. Cl.$^7$ ............................ C04B 35/149

(52) U.S. Cl. .................. 252/62.9 R; 252/62.91 PZ; 501/135; 501/136; 501/137; 501/138; 501/139

(58) Field of Search ............. 252/62.9 PZ, 62.9 R; 501/134, 135, 136, 137, 138, 139

(56) References Cited

U.S. PATENT DOCUMENTS

| 4,882,079 A | * 11/1989 | Tomita et al. ........ 252/62.9 PZ |
| 4,990,324 A | 2/1991 | Tomita et al. |
| 5,605,648 A | * 2/1997 | Satou et al. .......... 252/62.9 PZ |

FOREIGN PATENT DOCUMENTS

| JP | 60-215568 | 10/1985 |
| JP | 63-151673 | * 6/1988 |
| JP | 8-728 | 3/1990 |
| JP | 8-290903 | 11/1996 |

* cited by examiner

*Primary Examiner*—C. Melissa Koslow
(74) *Attorney, Agent, or Firm*—Nixon & Vanderhye P.C.

(57) ABSTRACT

A piezoelectric material exhibiting a high Curie point and a high displacement at a low drive voltage is provided. The piezoelectric material contains as a main component a composite oxide and is expressed by the general formula $[Pb\{1-x_1-x_2-\alpha(x_1-x_2)\}, A_1x_1, A_2x_2]\{(Ti_y, Zr_z)(1-\beta(x_1-x_2)-\gamma), (Y_{0.5}, Nb_{0.5})\gamma\}O_3$, where $y+z=1$, $1.15<z/y<1.30$ and $0<\gamma<0.1$; and $A_1, A_2, x_1, x_2$ satisfy any of the conditions (i) $A_1$ is at least selected one of Ce and La, $A_2$ is K, $0.02 \leq x_1 < 0.08$, $0 \leq x_2 \leq 0.05$ ($0.02 \leq x_1+x_2 \leq 0.1$, $x_1 \leq x_2$) and $\alpha=0$, $\beta=0.25$ or $\alpha=0.5$, $\beta=0$, and (ii) $A_1$ is Sr, $A_2$ is Ba, $0.03 \leq x_1 \leq 0.05$, $0.03 \leq x_2 \leq 0.05$ ($|x_1-x_2| \leq 0.01$), and $\alpha=0$, $\beta=0$.

8 Claims, 4 Drawing Sheets

PIEZOELECTRIC MATERIAL AND MANUFACTURING METHOD THEREOF

BACKGROUND OF THE INVENTION

1. Field of the Invention

The present invention relates to a piezoelectric ceramic material used in, for example, automotive equipment, actuators and sensors for various electrical equipment, etc.

2. Description of the Related Art

A piezoelectric material has the function of converting electrical energy into mechanical energy (or mechanical energy into electrical energy), and actuators, etc. using this function are known. The piezoelectric actuator, which generates a displacement corresponding to an applied voltage and has a fast response, is used as a drive unit for flow control valves, injectors or the like, and thus makes it possible to precisely control the flow rate or the injection amount, as the case may be. Also, an ultrasonic motor using ultrasonic oscillation of the piezoelectric element as a drive source is useful in small electrical equipment, and further finds a wide variety of practical applications such as an acceleration sensor for detecting the force due to the acceleration as an electrical signal and an ultrasonic sensor for detecting an object or measuring the distance by transmitting and receiving an ultrasonic wave.

A ceramic piezoelectric material generally has a composite perovskite structure expressed as A (bivalent) B (quadrivalent) $O_3$. A known typical example is $Pb(Ti, Zr)O_3$ or what is called PZT. There are also materials made by substituting a specific element for a part of the A site or the B site of PZT or adding various additives thereto. As an example, Japanese Examined Patent Publication No. 8-728 discloses a composition having the piezoelectric characteristic thereof improved by substituting La for a part of the Pb and adding not more than 1.0 weight % of $MnO_2$. Various other attempts have been made to improve the piezoelectric characteristic by substituting Sr, Ba, Ca, etc. for the A site or Ni, Nb, etc. for the B site, or adding $Cr_2O_3$, etc.

These piezoelectric materials are normally classified roughly into two types. One is a material (soft material) of a high piezoelectric constant (high d), the features of which are that (1) the piezoelectric constant is high, (2) the dielectric loss is large, and (3) the Curie point is as low as about 100 to 150° C. The other type is a material (hard material) with a high Curie point, which generally has the features that (1) the piezoelectric constant is small, (2) the dielectric loss is small, and (3) the Curie point is high.

The piezoelectric constant is a large factor affecting the displacement, and a soft material having a high dielectric constant is considered a promising material for attaining a large displacement. Due to the high dielectric loss, however, the electrical energy received cannot be effectively converted to the mechanical energy, resulting in a small displacement. Further, the lost energy is presented as thermal energy, and therefore the temperature of the material itself rises. Especially when the Curie point is approached, the polarization is lost and the displacement is liable to be lost.

The hard material, on the other hand, in spite of a small dielectric loss and a high electromechanical conversion efficiency, is small in piezoelectric constant d and therefore requires a high drive voltage to attain the desired displacement.

To attain a large displacement with a low drive voltage, a large piezoelectric constant d and a small dielectric loss are desired. As described above, however, the soft material has a large dielectric loss, while the hard material has a small piezoelectric constant. The dielectric loss of even the hard material, though small, is not zero. Therefore, some heat is generated, and the dielectric constant thereof, affecting the displacement, increases sharply at about the Curie point. To exhibit a stable piezoelectric characteristic in the operating temperature range, therefore, a material with a high Curie point is required.

As a material group expected to produce a high Curie point and a large displacement, the present inventors have studied the possibility of introducing a bivalent substitute atom such as Sr into the A site of the composite oxide expressed as Pb (Ti, Zr, Y, Nb) $O_3$. In the case where the substitution amount of Sr is increased as required to obtain a high displacement, however, the Curie point is considerably decreased. Conversely, the suppression of the decrease of the Curie point prevents a sufficient displacement. Therefore, the development of a piezoelectric material which can provide a large displacement, without reducing the curie point considerably, is highly desired.

SUMMARY OF THE INVENTION

The primary object of the present invention is to provide a piezoelectric material having a high Curie point, which is superior in high temperature stability and which exhibits a large displacement at a low drive voltage.

In view of the above-mentioned situation, the present inventors have variously studied substitute atoms to be introduced into the A Site of the composite oxide of Pb (Ti, Zr, Y, Nb) $O_3$ group, the optimum values of the ratio of substitution thereof and the ratio of each component element.

Thus, it has been found that a high displacement and a high curie point can be effectively attained by a piezoelectric material containing, as a main component, a composite oxide expressed by the general formula $$[Pb\{1-x_1-x_2-\alpha(x_1-x_2)\}, A_1x_1, A_2x_2]$$
$$\{(Ti_y, Zr_z) (1-\beta(x_1-x_2)-\gamma), (Y_{0.5}, Nb_{0.5})\gamma\}O_3 \quad (1)$$

where y+z=1, 1.15<z/y<1.30, 0<γ<0.1, and $A_1$, $A_2$, $x_1$, $x_2$  satisfy specific conditions.

DESCRIPTION OF THE PREFERRED EMBODIMENTS

The piezoelectric material according to the present invention is expressed by the general formula $$\{(Ti_y, Zr_z)(1-\beta(x_1-x_2)-\gamma), (Y_{0.5}, Nb_{0.5})\gamma\}O_3 \quad (1)$$

where $y+z=1$, $1.15<z/y<1.30$, $0<y<0.1$, and wherein the piezoelectric material contains as a main component a composite oxide in which $A_1$, $A_2$, $x_1$, $x_2$ satisfy any one of the following conditions (i) to (iii):

(i) Condition (A)
$A_1$ is at least selected one of Ce and La,
$A_2$ is K, $0.02 \leq x_1 < 0.08$, $0 \leq x_2 \leq 0.05$
$(0.02 \leq x_1+x_2 \leq 0.1, x_1 \geq x_2)$
$\alpha=0.5$, $\beta=0$ (ii) Condition (B)
$A_1$ is at least selected one of Ce and La,
$A_2$ is K, $0.02 \leq x_1 < 0.08$, $0 \leq x_2 \leq 0.05$
$(0.02 \leq x_1+x_2 \leq 0.1, x_1 \geq x_2)$
$\alpha=0$, $\beta=0.25$ (iii) $A_1$ is Sr, $A_2$ is Ba
$0.03 \leq x_1 \leq 0.05$, $0.03 \leq x_2 \leq 0.05$
$(|x_1-x_2| \leq 0.01)$
$\alpha=0$, $\beta=0$ The piezoelectric material according to this invention contains, as a main component, at least one composite oxide having any one of the compositions described in (i) to (iii) above, and may contain two or more of them.

The conditions (i) and (ii) refer to the case in which an atom of a different valence (other than bivalent atoms) is substituted for a part of the Pb. Specifically, in the general formula (1), at least a selected one of Ce and La is used preferably as $A_1$, and K as $A_2$, as expressed in the general formula (2) below.

$$\{(Ti_y, Zr_z)(1-\beta(x_1-x_2)-\gamma), (Y_{0.5}, Nb_{0.5})\gamma\}O_3 \quad (2)$$

The composite oxide expressed by the general formula (2) has Ce (trivalent/quadrivalent), La (trivalent) and K (monovalent) of a different valence in the A site which was originally occupied by the bivalent Pb ion. In the process, a hole is formed in the A site or the B site in order to maintain chemical stability. By forming this hole, a sufficient polarization occurs with a small amount of substitution, thereby making it possible to achieve a large displacement at the time of application of an electric field. Also, the small substitution amount suppresses the effect on the Curie point, as described below.

Generally, the reason why the displacement is improved by substitution is considered due to the fact that the response to the electric field increases. One of the main factors for changing the response to the electric field is the polarization, which is caused by, for example, the asymmetry of the charge distribution. In the case where atoms having different ion radii locally exist due to the substitution, an asymmetry of the charge distribution results, with the result that the polarization which otherwise might be offset by the symmetry in the presence of charge distribution is not offset. One cause of the reduction in Curie point by the substitution is considered to be the distortion of the lattice due to the different ion radii.

In the case where the substituted atom has a valence different from Pb (other than bivalent atoms) as in (i) or (ii), on the other hand, a hole is formed for maintaining the electrical neutrality. Specifically, the charge distribution is changed by the generation of a hole as well as by the difference in ion radius, so that the charge distribution (contributing to the displacement) undergoes a change larger than the lattice distortion (contributing to the Curie point). As a result, a high displacement can be obtained without substantially reducing the Curie point.

It is assumed that the amount of substitution $x_1$ is in the range of $0.02 \leq x_1 < 0.08$ when $A_1$ is Ce or La. In the case where $x_1$ is less than 0.02, the effects of the present invention cannot be achieved, while in the case where $x_1$ is 0.08 or more, it is difficult to secure both a high Curie point and a high displacement. More preferably, therefore, the amount of substitution is in the range of $0.02 \leq x_1 \leq 0.06$. In addition to trivalent La or Ce, monovalent K can be used as a substituted atom $A_2$ for charge conservation. Thus, in the case where $A_1$ and $A_2$ are substituted in the same amount, a similar effect can be obtained without forming a hole. An excessively large amount $x_2$ of substitution of $A_2$, however, reduces the strength. Therefore, the amount of substitution is set in the range of $0 \leq x_2 \leq 0.05$, while at the same time satisfying the relations $0.02 \leq x_1+x_2 \leq 0.1$, $x_1 \geq x_2$. It is not desirable that the total amount of substitution $x_1+x_2$ exceed 0.1 as the displacement would otherwise be conversely reduced.

The conditions for $\alpha$ and $\beta$ are set taking the generation of a hole by the substituted atom into consideration. The condition (A), i.e. $\alpha=0.5$, $\beta=0$ in (i) indicates a theoretical version of the general formula (1) on the assumption that a hole is generated in the A site. The condition (B), i.e. $\alpha=0$, $\beta=0.25$ in (ii) indicates a theoretical version of the general formula (1) on the assumption that a hole is generated in the B site. Where, the A site and the B site, a hole is formed is theoretically determined by the substituted atom, and a hole is formed only in a more stable site, in terms of energy. Actually, however, both of the compositions (i) and (ii) are possible according to the manufacturing conditions. Specifically, the non-uniformity of the material after mixing and a limitation on firing time of the material may cause a hole to be formed in the A site for some parts, while causing a hole to be formed in the B site for other parts, followed by slow cooling as it is formed.

In view of this, according to this invention, the mixing ratio of the initial materials of each component element is calculated from the general formula (1) in such a manner as to satisfy the condition (i) or (ii), and a piezoelectric material is produced using the material thus prepared. In the case where the material is prepared on the assumption that a hole is generated in the A site, for example, the number of holes formed in the A site is increased in terms of probability. Also, by predicting such holes to avoid the preparation of an extraneous material (for example, Pb in the case of holes in the A site), the deterioration of the piezoelectric characteristic which otherwise might be caused by the extraneous material can be prevented. In the case where the material is prepared without predicting holes, holes is which may be formed in the A site generate an excessive amount of Pb, which is deposited as PbO having no piezoelectric characteristic, thereby suppressing the piezoelectric characteristic of the piezoelectric material as a whole. Specifically, PbO having no piezoelectric characteristic, as well as the piezoelectric material, has to be displaced (or moved) by the displacement energy converted by the piezoelectric characteristic, resulting in a larger energy loss for a smaller displacement. In other words, the extraneous material may partly fail to form a hole and may cause a chemical instability for a reduced Curie point.

In manufacturing the piezoelectric material conforming with the conditions (i) or (ii), oxides, hydroxides, carbonates, etc. of various component elements are used as an initial material. These component elements of the initial material are prepared to assure the ratio between the component elements of the desired composition. The component elements of the material thus prepared are mixed, calcined, crushed and granulated, followed by baking, thereby producing a piezoelectric material having contents conforming with at least one of the conditions (i) and (ii). A piezoelectric material having the composition satisfying both the conditions (i) and (ii) may be finally obtained.

As described above, according to this invention, a material is prepared on the assumption that holes are formed in the A site or the B site according to the condition (A) or (B) of (i) or (ii), respectively. By thus minimizing the energy loss, a larger displacement can be obtained than when neither the condition (A) nor the condition (B) is taken into consideration. Also, a higher Curie point can be obtained by improving the chemical stability.

The condition (iii) is associated with a piezoelectric material having a composition in which Sr and Ba are introduced into the position of Pb, by use of Sr as $A_1$ and Ba as $A_2$. This is expressed by the general formula (3) below.

$$[Pb\{1-x_1-x_2\}, Srx_1, Bax_2]$$

Both Sr and Ba are bivalent, and therefore no holes are formed, with the result that $\alpha=0$ and $\beta=0$. In the process, the values of $x_1$, $x_2$ are selected in such a manner that the substitution amount $x_1$ of Sr satisfies the relation $0.03 \leq x_1 \leq 0.05$ and the substitution amount $x_2$ of Ba satisfies the relation $0.03 \leq x_1 \leq 0.05$, while at the same time meeting the condition $|x_1-x_2| \leq 0.01$. Then, a high Curie point and a high displacement can both be attained at the same time.

In the case where a bivalent atom is substituted for Pb, the effect of forming a hole due to the difference of ion valence is not exhibited. The substitution amount in the range in which the reduction in the Curie point is suppressed, therefore, fails to sufficiently improve the displacement. Increasing the substitution amount to a somewhat larger value for attaining a sufficient displacement, on the other hand, the Curie point is extremely reduced. The reduction of the Curie point is considered to be caused by the difference between ion radii. As compared with the ion radius of Pb, the ion radius of Sr is small, while the ion radius of Ba is larger than that of Pb. For both Sr and Ba, an ion of a different radius enters the position (A site) stabilized by Pb, and therefore the lattice is distorted. As a result, the stability is reduced in terms of energy with the probable result that the temperature range of the crystal system indicating the piezoelectric characteristic is reduced.

In view of the fact that the polarization caused by the lattice distortion is considered to contribute to the displacement, on the other hand, the displacement can be improved while suppressing the reduction in the Curie point by distorting the lattice and thus causing the polarization in such a manner that the crystal structure exhibiting the piezoelectric characteristic is not made unstable by the particular distortion. This can be accomplished by making the substitution amounts $x_1$, $x_2$ of Sr, Ba substantially equal to each other. As described above, the lattice is distorted by substituting an atom of a different ion radius. In the process, Sr having a smaller ion radius than Pb and Pa having a larger ion radius than Pb in substantially the same amount are used as atoms substituted for Pb. Then, the distortion is partially recessed and partially protruded, so that the lattice constants of the recess and the protrusion conform with each other. In this way, the lattice distortion may be limited to a local one. Thus, the stability of the material composed of only Pb atoms in the surrounding A site prevents the crystal structure exhibiting the piezoelectric characteristic from becoming unstable, thereby making it possible to produce a material which can hold the stability of the structure as a whole.

The material having the A site composed of Pb atoms alone used conventionally has a high stability of the crystal layer exhibiting the piezoelectric characteristic. Therefore, the structure in which the recess and the protrusion of the lattice caused by the substituted material are close to each other and offset from each other, thus leaving many portions of the structure having only the Pb atom, is higher in stability than the structure in which the recess and the protrusion are far from each other. Thus, the former structure can improve the displacement while suppressing the reduction in the Curie point.

To obtain the required displacement, the substitution amounts $x_1$, $x_2$ are set in the range satisfying the relation $0.03 \leq x_1 \leq 0.05$, $0.03 \leq x_2 \leq 0.05$. It is undesirable that $x_1$, $x_2$ exceed 0.05 and the total amount of substitution exceeds 0.1, in which case the displacement is conversely reduced. Also, in order to secure the stability of the crystal, the difference between $x_1$ and $x_2$ should be as small as possible and, by selecting $x_1$, $x_2$ in such a manner that $|x_1-x_2|$ may not exceed 0.01, the effects described above can be produced.

According to this invention, in any of the conditions (i) to (iii), y and z are selected in such a manner that the ratio Zr/Ti (the ratio z/y) satisfies the relations $y+z=1$ and $1.15<z/y<1.30$. As a result, the displacement is so improved that it assumes a maximum value especially at about $z/y=1.22$. In the case where $z/y$ is less than 1.15 or more than 1.30, on the other hand, the displacement is reduced.

The displacement is further improved by introducing Y, Nb into the B site in the general formula (1). In the case where the total substitution amount $\gamma$ becomes 0.1 or more, however, the displacement cannot be improved but is reduced conversely. Therefore, the relation $0<\gamma<0.1$ should be maintained.

At least one of $Sb_2O_3$, $Mn_2O_3$ and $Nb_2O_3$ can be added as an additive to the piezoelectric material according to this invention. Especially, $Sb_2O_3$ is preferably used. The proportion of the additive contained in the piezoelectric material is preferably not more than 0.5 weight % and more preferably not more than 0.3 weight %. This improves the displacement remarkably. In preparing a piezoelectric material using an additive, the additive is mixed with the material to be prepared, calcined, baked and otherwise subsequently processed in a similar fashion.

EXAMPLES 1 TO 6

Comparative Examples 1 to 5

In order to ascertain the effects of this invention, the piezoelectric characteristic of the piezoelectric material obtained was studied by changing $A_1$, $A_2$ and the substitution amounts $x_1$, $x_2$ thereof variously in the general formula (1).

$$[Pb\{1-x_1-x_2-\alpha(x_1-x_2)\}, A_1x_1, A_2x_2]$$

First, the compounds shown in Table 1 were used as an initial material containing each component atom of the piezoelectric material and prepared in such a manner as to obtain the desired compositions shown in Table 2 (that is to say, in such a manner that the ratio between the component atoms in the intended composition is identical to the ratio between the component atoms in the initial material).

In the process, in addition to the piezoelectric material (Examples 1 to 6) satisfying the conditions (i) to (iii), a piezoelectric material (Comparative Examples 1 to 3) substituted only by Sr or K and a piezoelectric material (Comparative Examples 4 and 5) in which $A_1$ is Ce or La and the conditions for $\alpha$, $\beta$ fail to satisfy (i), (ii) were prepared for comparison. As for $\alpha$, $\beta$, the conditions (A) to (C) were defined as follows and indicated in the table (except for Example 5 where $x_1=x_2$).

Condition (A): $\alpha=0.5$, $\beta=0$
Condition (B): $\alpha=0$, $\beta=0.25$
Condition (C): $\alpha=0$, $\beta=0$ Also, in all cases, z/y was set to 1.22 and $\gamma$ to 0.01 in the general formula (1). Further, $Sb_2O_3$ of 0.3 weight % (proportion contained in the piezoelectric material obtained) was used as an additive.

TABLE 1

| Component atom | Compound | Component atom | Compound |
|---|---|---|---|
| Pb | PbO | La | $La_2O_3$ |
| Zr | $ZrO_2$ | K | $K_2CO_3$ |
| Ti | $TiO_2$ | Ce | $CeO_2$ |
| Y | $Y_2O_3$ | Sr | $SrCO_3$ |
| Nb | $Nb_2O_5$ | Ba | $BaCO_3$ |

TABLE 2

|  |  | A1 | A2 | X1 | X2 | z/y | γ | Condition | Additive | Displacement | Curie point |
|---|---|---|---|---|---|---|---|---|---|---|---|
| Example | 1 | Ce |  | 0.04 |  | 1.22 | 0.01 | (A) | 0.3 wt % | 22.8 μm | not less |
|  | 2 | Ce |  | 0.04 |  |  |  | (B) | $Sb_2O_3$ | 25.2 μm | than 320° C. |
|  | 3 | La |  | 0.04 |  |  |  | (A) |  | 29.6 μm | 280° C. |
|  | 4 | La |  | 0.04 |  |  |  | (B) |  | 29.4 μm | 280° C. |
|  | 5 | La | K | 0.02 | 0.02 |  |  |  |  | 26.1 μm | 260° C. |
|  | 6 | Sr | Ba | 0.04 | 0.04 |  |  | (C) |  | 29.4 μm | 295° C. |
| Comparative | 1 |  | K |  | 0.04 | 1.22 | 0.01 | (C) | 0.3 wt % |  |  |
| Example | 2 | Sr |  | 0.04 |  |  |  | (C) | $Sb_2O_3$ | 15.9 μm | not less than 320° C. |
|  | 3 | Sr |  | 0.09 |  |  |  | (C) |  | 19.9 μm | 280° C. |
|  | 4 | La |  | 0.04 |  |  |  | (C) |  | 21.3 μm | 250° C. |
|  | 5 | Ce |  | 0.04 |  |  |  | (C) |  | 22.8 μm | 300° C. |

The prepared materials, after being mixed, were calcined at 800° C. for two hours and crushed. The resulting material was mixed and granulated using a bowl mill. After that, the particle size of the material was adjusted by filtering, and thus particles exceeding 250 μm were removed. Further, after molding and baking, a sample in pellet form was produced. The two surfaces of the sample (0.5 mm thick) were lapped by a lapping machine with the electrodes printed and the outer periphery grounded (φ13 mm). By lamination and polarization, a piezoelectric material stack (20 mm thick) was formed.

The displacement and the curie point of the piezoelectric material stack were checked and described in Table 2. The displacement was measured by the following method. First, a load of 350 kgf (3430 N) was imposed on the piezoelectric material stack while applying thereto a voltage of 1.5 V for each thickness of 1 mm. At the same time, the displacement of the piezoelectric material stack was measured by a gap sensor. Two measuring points were selected and the average value at the two measuring points was determined as the displacement of a particular element. The measurement was conducted at room temperature with a stack element driven and aged for about 20 minutes.

Figure 1:
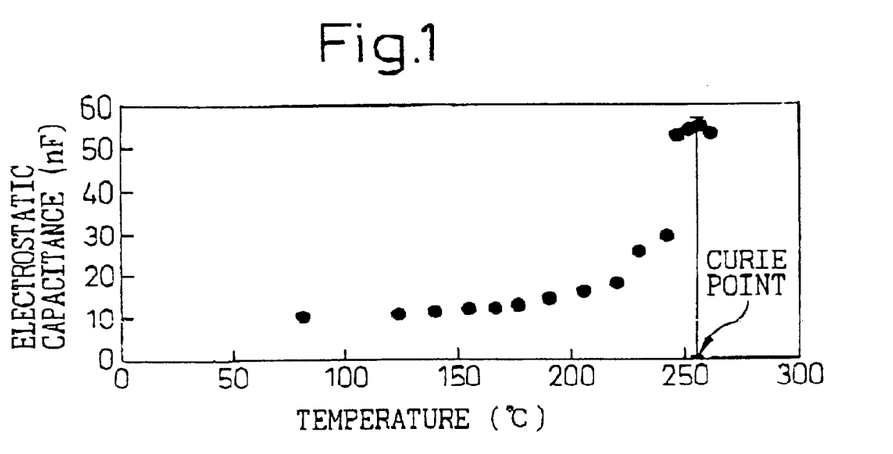
FIG. 1 is a diagram for explaining a method of measuring the Curie point based on the electrostatic capacitance.

On the other hand, the Curie point was measured using a sample in pellet form immediately after being printed with electrodes during the above-mentioned production process. The sample was held by terminals and placed in a dryer for temperature regulation, while at the same time being measuring the electrostatic capacitance by an impedance analyzer connected to the terminals. The relation between temperature and electrostatic capacitance obtained is shown in FIG. 1, for example, in which the temperature associated with the maximum electrostatic capacitance was determined as the Curie point.

As is apparent from Table 2, in the conventional composition in which only Sr is substituted for Pb, the displacement for the substitution amount $x_1$ of 0.04 is as low as 15.9 μm (Comparative Example 2), and even for the Comparative Example 3 with $x_1$ double or larger, the figure is not more than 20 μm. In the case where an element such as Ce, which is not bivalent, is used as $A_1$, in contrast, the displacement is improved to 22.8 μm (Example 1) or 25.2 μm (Example 2), while at the same time improving the Curie point remarkably to 320° C.

Also, in the third and fourth embodiments using La as $A_1$, a high displacement of 29 μm or more is obtained without reducing the Curie point.

Now, consider the conditions (A) to (C) for $\alpha$, $\beta$ in the general formula (1) for $A_1$ as Ce, La. In Examples 1–4 for which the conditions (A), (B) take the generation of a hole into account, the Curie point is high and the displacement is improved as compared with Comparative Examples 4, 5 for the condition (C) assumed to generate no hole. In the case where $A_1$ is La, for example, the Curie point is improved from 250° C. to 280° C. with the displacement also remarkably improved in Examples 3 and 4 based on the conditions (A), (B) as compared with Comparative Example 4 based on the condition (C). In similar fashion, when $A_1$ is Ce, the Curie point as high as 320° C. or higher is obtained with an equivalent or higher displacement as compared with the Curie point of 300° C. for Comparative Example 5.

Further, according to Example 5 in which K and La have the same substitution amount ($x_1=x_2$) by setting $A_1$ to La and $A_2$ to K in addition to the conditions (A), (B), the Curie point and the displacement are improved as compared with Comparative Example 4 based on the condition (C) for $A_1$ as La. In this way, by employing the trivalent Ce or La as $A_1$ and satisfying the conditions (A), (B), a piezoelectric material of a high curie point and a high displacement can be obtained. Alternatively, the monovalent K may also be added as $A_2$ for effectively improving the characteristic. In Comparative Example 1 in which the substituted element is K alone, however, cracking occurs in the process of lapping the two surfaces of the pellet, thereby making it impossible to produce a stack element. In view of the fact that adding K leads to the reduction in strength, the relation $x_1 \geq x_2$ is preferably set so as to maintain the strength.

Also, according to Example 6 in which Ba is added as $A_2$ in the same amount as Sr in Comparative Examples 2 and 3 in which only Sr is substituted, the Curie point is somewhat reduced as compared with Comparative Examples 2 and 3 (the Curie point is nearly equal to that of the sample, in which the amount of Sr substitution is in the range of 0.04 to 0.09), while the displacement is significantly increased. Specifically, a displacement is obtained which is large and cannot be attained even in the case where the amount of substitution of Sr, i.e. the A site amount of substitution is increased from 0.04 to 0.09. As a result, it is seen that the displacement can be effectively improved without extremely reducing the stability of the crystal exhibiting the piezoelectric characteristic by setting the substitution amount of Sr and Ba to the substantially same amount for $A_1$ as Sr and $A_2$ as Ba.

EXAMPLES 7 TO 10

Comparative Examples 6 to 12

The relation between the substitution amount and the displacement was also studied with reference to the case where Ce or La is substituted for the A site in the general formula (1). As shown in Tables 3 and 4 a stack element with the substitution amount $x_1$ of Ce and La variously changed in the range of 0.06 to 0.1 is produced in a similar manner to the aforementioned embodiments, and the displacement thereof was measured and described in Tables 3 and 4. Tables 3 and 4 also show the result of Examples 1–4.

As shown in Tables 3 and 4, the displacement of both Ce and La assumes a maximum value when $x_1$ is 0.04, indicating the tendency of the displacement to decrease with the increase in $x_1$. By setting the conditions (A), (B), however, the displacement is improved. For $x_1$ of 0 06, for example, Examples 7 and 8 based on the conditions (A), (B) with $A_1$ as Ce have a higher displacement than Comparative Example 6 based on the condition (C), while Examples 9 and 10 based on the conditions (A), (B) with $A_1$ as La have a higher displacement than Comparative Example 12 based on the condition (C). With the increase of $x_1$ to 0.08 or more, however, the decrease in the displacement is large. It is desirable, therefore, to set the substitution amount $x_1$ of Ce or La to a value in the range not exceeding 0.08.

EXAMPLES 11 TO 26

Comparative Examples 13 to 20

The relation between the ratio z/y and the displacement in the general formula (1) was studied. With regard to the composition according to Example 2 based on the condition (B) with $A_1$ as Ce, a piezoelectric material was prepared by a similar method while changing the ratio z/y (ratio Zr/Ti) in the range of 1.15 to 1.30 as shown in Table 5, and the displacement was measured in a similar manner to Example 1. The result is noted in Table 5 (with the result for Example 2). Also, with regard to the composition according to Example 3 based on the condition (A) with $A_1$ as La, the composition according to Example 4 based on the condition (B) with $A_1$ as La and the composition according to Example 6 with $A_1$ as Sr and $A_2$ as Ba, a piezoelectric material was prepared while changing the ratio z/y in similar method, and the displacement was measured. The result is shown in Tables 6 to 8, respectively.

TABLE 3

|  |  | A1 | A2 | X1 | X2 | z/y | γ | Condition | Additive | Displacement |
|---|---|---|---|---|---|---|---|---|---|---|
| Example | 1 | Ce |  | 0.04 |  | 1.22 | 0.01 | (A) | 0.3 wt % | 22.8 μm |
|  | 2 | Ce |  | 0.04 |  |  |  | (B) | $Sb_2O_3$ | 25.2 μm |
|  | 7 | Ce |  | 0.06 |  |  |  | (A) |  | 13.4 μm |
|  | 8 | Ce |  | 0.06 |  |  |  | (B) |  | 20.9 μm |
| Comparative | 6 | Ce |  | 0.06 |  | 1.22 | 0.01 | (C) | 0.3 wt % | 12.5 μm |
| Example | 7 | Ce |  | 0.08 |  |  |  | (A) | $Sb_2O_3$ | 8.6 μm |
|  | 8 | Ce |  | 0.1 |  |  |  | (A) |  | 8.5 μm |
|  | 9 | Ce |  | 0.1 |  |  |  | (B) |  | 15.0 μm |

TABLE 4

|  |  | A1 | A2 | X1 | X2 | z/y | γ | Condition | Additive | Displacement |
|---|---|---|---|---|---|---|---|---|---|---|
| Example | 3 | La |  | 0.04 |  | 1.22 | 0.01 | (A) | 0.3 wt % | 29.6 μm |
|  | 4 | La |  | 0.04 |  |  |  | (B) | $Sb_2O_3$ | 29.4 μm |
|  | 9 | La |  | 0.06 |  |  |  | (A) |  | 24.8 μm |
|  | 10 | La |  | 0.06 |  |  |  | (B) |  | 23.0 μm |
| Comparative | 10 | La |  | 0.08 |  | 1.22 | 0.01 | (A) | 0.3 wt % | 19.4 μm |
| Example | 11 | La |  | 0.08 |  |  |  | (B) | $Sb_2O_3$ | 12.3 μm |
|  | 12 | La |  | 0.06 |  |  |  | (C) |  | 17.4 μm |

TABLE 5

| | | A1 | A2 | X1 | X2 | z/y | γ | Condition | Additive | Displacement |
|---|---|---|---|---|---|---|---|---|---|---|
| Example | 11 | Ce | | 0.04 | | 1.18 | 0.01 | (B) | 0.3 wt % | 20.8 μm |
| | 12 | Ce | | | | 1.20 | | | $Sb_2O_3$ | 21.6 μm |
| | 2 | Ce | | | | 1.22 | | | | 25.2 μm |
| | 13 | Ce | | | | 1.24 | | | | 23.6 μm |
| | 14 | Ce | | | | 1.26 | | | | 21.1 μm |
| Comparative | 13 | Ce | | 0.04 | | 1.15 | 0.01 | (B) | 0.3 wt % | 20.3 μm |
| Example | 14 | Ce | | | | 1.30 | | | $Sb_2O_3$ | 18.8 μm |

TABLE 6

| | | A1 | A2 | X1 | X2 | z/y | γ | Condition | Additive | Displacement |
|---|---|---|---|---|---|---|---|---|---|---|
| Example | 15 | La | | 0.04 | | 1.18 | 0.01 | (A) | 0.3 wt % | 23.7 μm |
| | 16 | La | | | | 1.20 | | | $Sb_2O_3$ | 24.1 μm |
| | 3 | La | | | | 1.22 | | | | 29.6 μm |
| | 17 | La | | | | 1.24 | | | | 26.6 μm |
| | 18 | La | | | | 1.26 | | | | 26.2 μm |
| Comparative | 15 | La | | 0.04 | | 1.15 | 0.01 | (A) | 0.3 wt % | 23.5 μm |
| Example | 16 | La | | | | 1.30 | | | $Sb_2O_3$ | 24.5 μm |

TABLE 7

| | | A1 | A2 | X1 | X2 | z/y | γ | Condition | Additive | Displacement |
|---|---|---|---|---|---|---|---|---|---|---|
| Example | 19 | La | | 0.04 | | 1.18 | 0.01 | (B) | 0.3 wt % | 25.1 μm |
| | 20 | La | | | | 1.20 | | | $Sb_2O_3$ | 26.5 μm |
| | 4 | La | | | | 1.22 | | | | 29.4 μm |
| | 21 | La | | | | 1.24 | | | | 28.7 μm |
| | 22 | La | | | | 1.26 | | | | 23.1 μm |
| Comparative | 17 | La | | 0.04 | | 1.15 | 0.01 | (B) | 0.3 wt % | 24.0 μm |
| Example | 18 | La | | | | 1.30 | | | $Sb_2O_3$ | 19.5 μm |

TABLE 8

| | | A1 | A2 | X1 | X2 | z/y | γ | Condition | Additive | Displacement |
|---|---|---|---|---|---|---|---|---|---|---|
| Example | 23 | Sr | Ba | 0.04 | 0.04 | 1.18 | 0.01 | (C) | 0.3 wt % | 24.3 μm |
| | 24 | Sr | Ba | | | 1.20 | | | $Sb_2O_3$ | 26.0 μm |
| | 6 | Sr | Ba | | | 1.22 | | | | 29.4 μm |
| | 25 | Sr | Ba | | | 1.24 | | | | 26.7 μm |
| | 26 | Sr | Ba | | | 1.26 | | | | 24.6 μm |
| Comparative | 19 | Sr | Ba | 0.04 | 0.04 | 1.15 | 0.01 | (C) | 0.3 wt % | 23.0 μm |
| Example | 20 | Sr | Ba | | | 1.30 | | | $Sb_2O_3$ | 23.0 μm |

Figure 2:
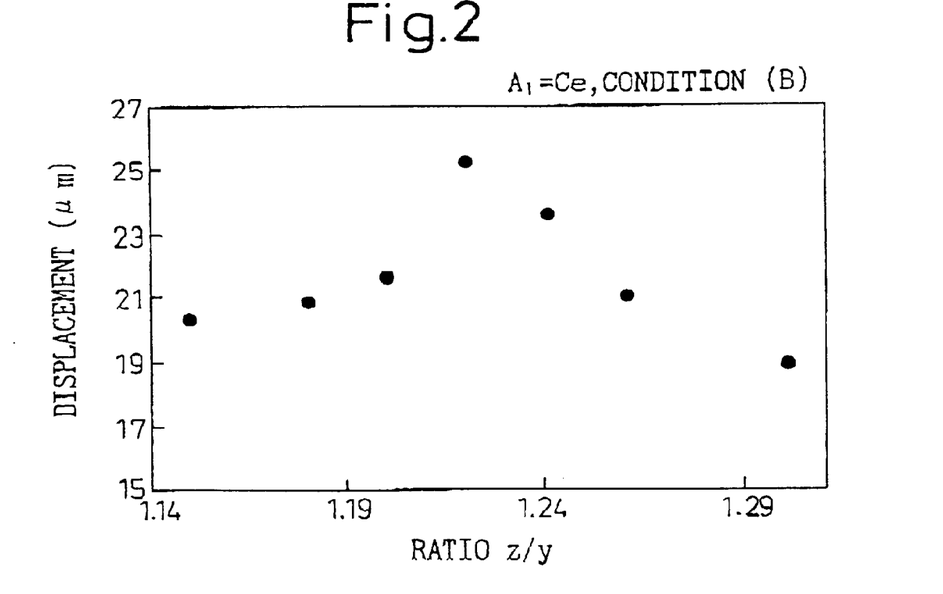
FIG. 2 is a diagram showing the z/y dependency of the displacement under the condition that $A_1$ is Ce (condition (B)).

Further, based on the data described in Table 5, the dependency of the displacement on the ratio z/y (ratio Zr/Ti) with $A_1$ as Ce (condition (B)) is shown in FIG. 2. As shown, with the increase of the ratio z/y from 1.15, the displacement increases gradually, and when 1.20 is exceeded, the displacement sharply increases and reaches a maximum value at about 1.22. With a further increase in the ratio z/y, the displacement is decreased again, and when 1.30 is reached, the displacement is extremely reduced. A superior characteristic is exhibited, therefore in the z/y range of 1.15 to 1.30.

Figure 3:
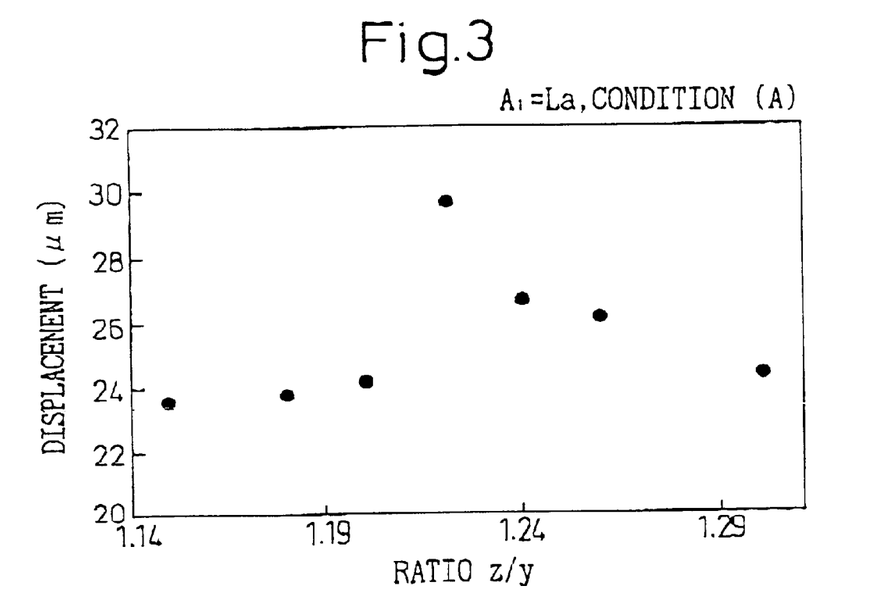
FIG. 3 is a diagram showing the z/y dependency of the displacement under the condition that $A_1$ is La (condition (A)).
Figure 4:
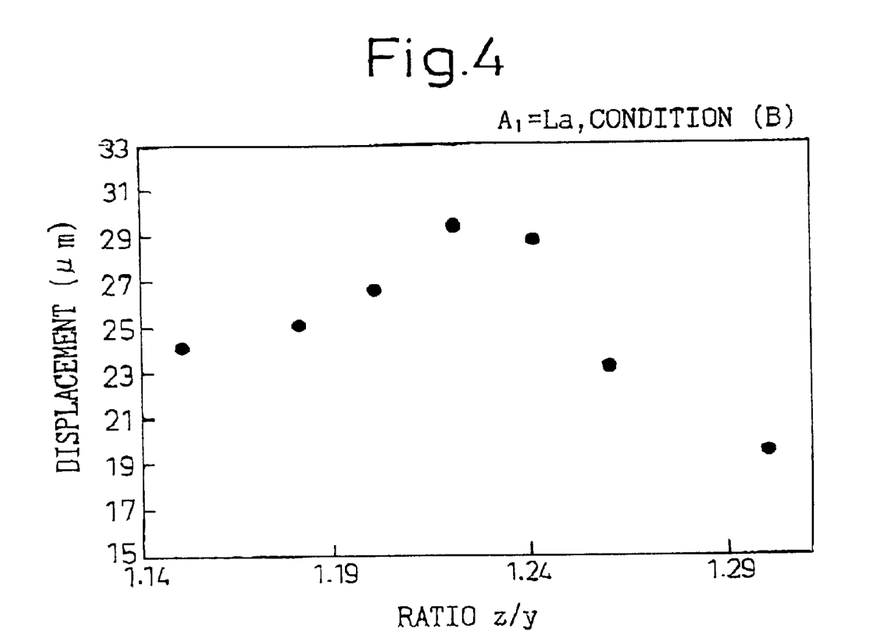
FIG. 4 is a diagram showing the z/y dependency of the displacement under the condition that $A_1$ is La (condition (B)).
Figure 5:
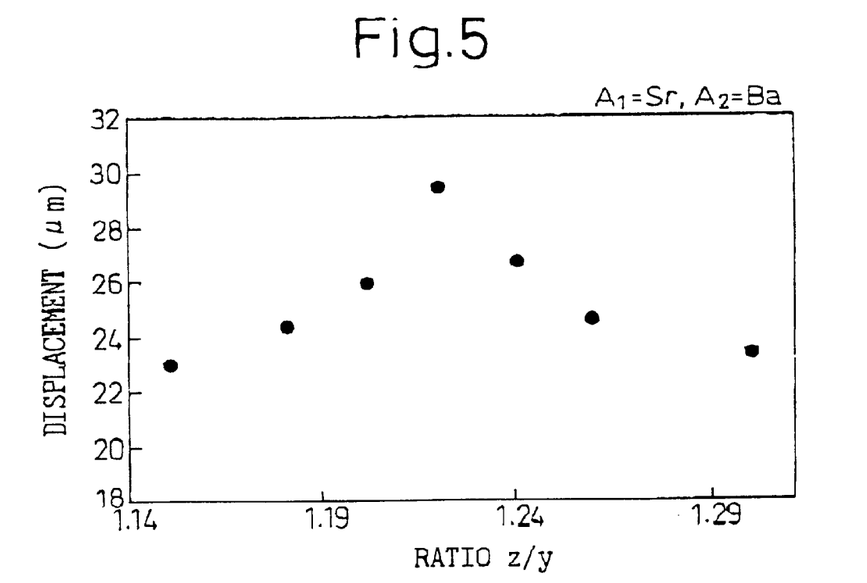
FIG. 5 is a diagram showing the z/y dependency of the displacement under the condition that $A_1$ is Sr and $A_2$ is Ba.

On the other hand, based on the data described in Table 6, the dependency of the displacement on the ratio z/y (ratio Zr/Ti) with $A_1$ as La (condition (A)) is shown in FIG. 3. In a similar fashion, based on the data described in Tables 7 and 8, the dependency of the displacement on the ratio z/y (ratio Zr/Ti) with $A_1$ as La (condition (B)) is shown in FIG. 4, and the dependency of the displacement on the ratio z/y (ratio Zr/Ti) with $A_1$ as Sr and $A_2$ as Ba is shown in FIG. 5. In all of these cases, the displacement becomes maximum when z/y is about 1.22, and the displacement is increased when the ratio z/y is in the range of 1.15 to 1.30, indicating a similar tendency.

Figure 6:
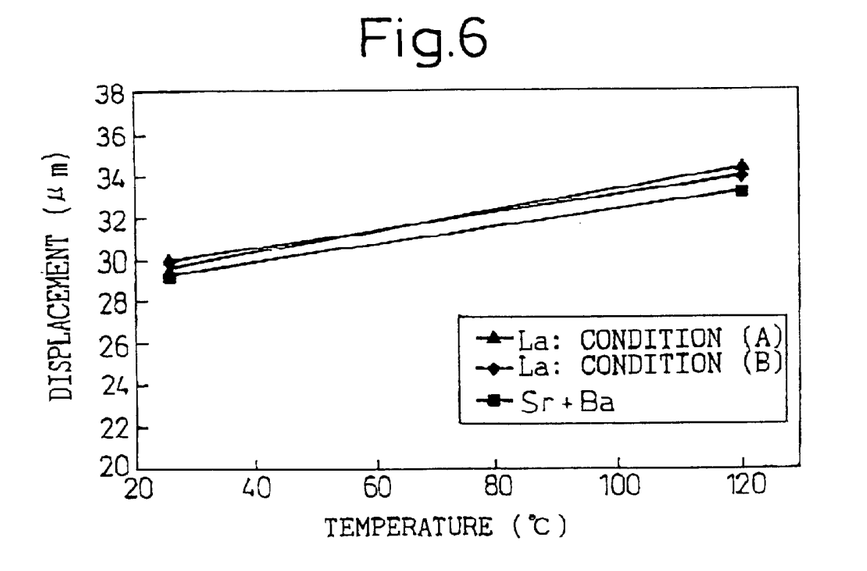
FIG. 6 is a diagram showing the temperature dependency of the displacement (z/y constant).

Now, FIG. 6 shows the temperature dependency of the displacement for z/y of 1.22. In FIG. 6, the change of the displacement is shown when the temperature is increased from room temperature to 120° C. for the piezoelectric materials according to Example 3 ($A_1$ as La, condition (A)), Example 4 ($A_1$ as La, condition (B)) and Example 6 ($A_1$ as Sr, $A_2$ as Ba). In all of these cases, the displacement is slightly increased when the temperature increases to a high level, but the temperature dependency is comparatively small. A small temperature dependency of the displacement narrows the range of change of the conditions attached to always obtain a constant displacement under the operating conditions. This leads to the advantage that the drive circuit can be simplified, for example, in an automotive application with large changes in the environmental temperature.

Figure 7:
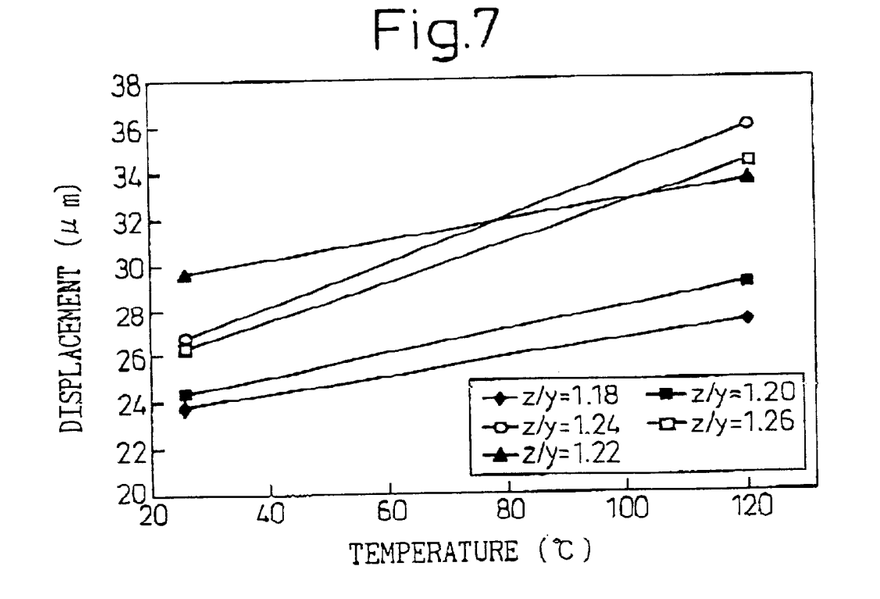
FIG. 7 is a diagram showing the temperature dependency of the displacement with the ratio z/y changed.

FIG. 7 shows the result of studying the temperature dependency of the displacement for Examples 3 and 15–18 when the ratio z/y is changed with $A_1$ as La (condition (A)). From FIG. 7, it can be seen that the temperature dependency is small for z/y in the range of 1.19 to 1.22. For the material having z/y of 1.18 or 1.20, though smaller in displacement than the material having z/y of 1.22, the drive circuit can be advantageously simplified as described above. With the material having z/y of 1.24 or 1.26, on the other hand, the displacement is larger, the higher the temperature, so that at 120° C., the displacement is larger than that for the material having z/y of 1.22. In this case, though lacking the advantage of low temperature dependency, the displacement is improved remarkably, and therefore a large effect is exhibited in applications in high temperature environments.

From the foregoing description, it can be understood that setting the ratio z/y in the range according to this invention (1.15<z/y<1.30), the displacement is improved and the effect of decreasing the temperature dependency is exhibited, thereby contributing to improved piezoelectric characteristics.

EXAMPLES 27–30

A piezoelectric material was prepared by a similar method to Examples 3 and 6 while changing only the type and amount of the additive, and the effect of the additive was studied. In place of $Sb_2O_3$, $Mn_2C_3$ or $Nb_2O_5$ were used as an additive, and a piezoelectric material was prepared by a similar method with the amount of the added additive as 0.5 weight %. Thus, the Curie point and the displacement were measured. The results are shown in Table 9. As is apparent from this table, a high displacement of 25 μm or more is obtained for both cases, and the Curie point is equal to or more than that for Examples 3 and 6.

EXAMPLE 33

Figure 8:
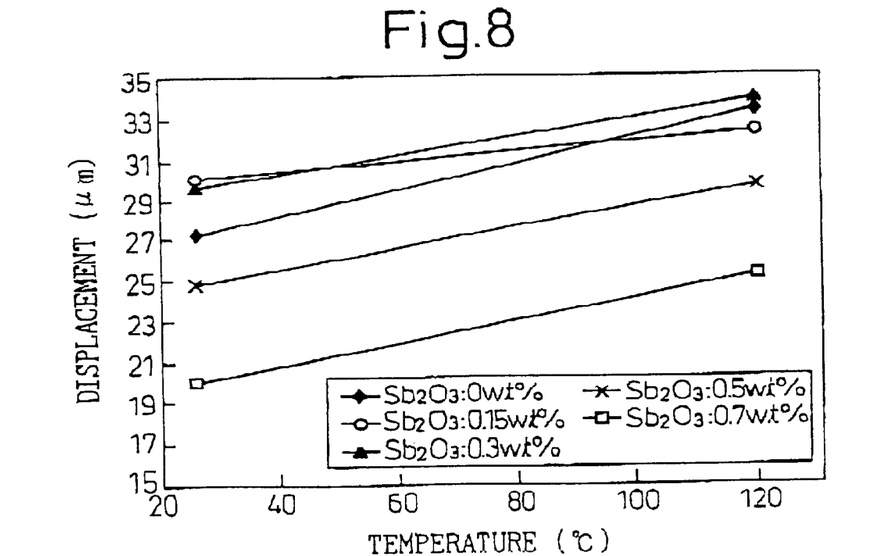
FIG. 8 is a diagram showing the relation between the amount of additives added and the displacement.

Further, in order to determine the optimum range of the amount of the additive to be added, a piezoelectric material was prepared by a similar method to Example 3 while changing the amount of $Sb_2O_3$ to be added in the range of 0 to 0.7 weight %, and the displacement was measured. The displacement and the temperature dependency thereof are shown in FIG. 8. As shown in FIG. 8, the displacement is large for the amount of the additive not more than 5 weight %, or especially, not more than 0.3 weight %, while the displacement is sharply decreased for the additive amount of 0.7 weight %. Also, the addition of $Sb_2O_3$ decreases the temperature dependency. This effect is especially large for the additive amount of about 0.15 weight %. Further, with the additive amount of 0.5 weight %, the displacement is comparatively small. Since the temperature dependency is also small, however, applications are suitably found in an environment subjected to large temperature changes.

What is claimed is:

1. A piezoelectric material containing, as a main component, a composite oxide expressed by the general formula $$[Pb\{_{1-x1-x2-\alpha(x1-x2)}\}, A_{1_{x1}}, A_{2_{x2}}]\{(Ti_y, Zr_z)_{(1-\beta(x1-x2)-\gamma)}, (Y_{0.5}, Nb_{0.5})_\gamma\}O_3 \quad (1)$$

TABLE 9

|  |  | A1 | A2 | X1 | X2 | z/y | γ | Condition | Additive | Displacement | Curie point |
|---|---|---|---|---|---|---|---|---|---|---|---|
| Example | 3 | La |  | 0.04 |  | 1.22 | 0.01 | (A) | 0.3 wt % | 29.6 μm | 280° C. |
|  | 6 | Sr | Ba | 0.04 | 0.04 |  |  | (C) | $Sb_2O_3$ | 29.4 μm | 295° C. |
|  | 27 | La |  | 0.04 |  |  |  | (A) | 0.5 wt % | 26.6 μm | 280° C. |
|  | 28 | Sr | Ba | 0.04 | 0.04 |  |  | (C) | $Nb_2O_3$ | 25.9 μm | 295° C. |
|  | 29 | La |  | 0.04 |  |  |  | (A) | 0.5 wt % | 25.3 μm | 280° C. |
|  | 30 | Sr | Ba | 0.04 | 0.04 |  |  | (C) | $Mn_2O_3$ | 25.4 μm | 300° C. |

EXAMPLES 31–32

Comparative Examples 31–34

The relation between γ(Y+Nb amount) and the displacement in the general formula (1) was studied. With regard to the composition according to Examples 3 and 6, a piezoelectric material with a value γ changed from 0 to 0.1 as shown in Table 10 was prepared, and the displacement was measured. The results are shown in Table 10. As compared with Comparative Examples 31 and 33 with γ=0, the displacement is obviously improved in Examples 3, 6, 31 and 32 with γ–0.01 or 0.05. In Comparative Examples 32 and 34 with γ=0.1, however, the displacement is smaller than that when γ=0. From this, it is seen that the displacement can be effectively improved for the piezoelectric material having γ in the range of 0 to 0.1.

where y+z=1, 1.15<z/y<1.30, 0<γ<0.1, and $A_1$, $A_2$, $x_1$, $x_2$ satisfy any of the following conditions:

(i) $A_1$ is at least selected from one of Ce and La, $A_2$ is K, $0.02 \leq x_1 < 0.08$, $0 \leq x_2 \leq 0.05$ ($0.02 \leq x_1+x_2 \leq 0.1$, $x_1 \geq x_2$), and α=0.5, β=0

(ii) $A_1$ is at least selected from one of Ce and La, $A_2$ is K, $0.02 \leq x_1 < 0.08$, $0 \leq x_2 \leq 0.05$ ($0.02 \leq x_1+x_2 \leq 0.1$, $x_1 \geq x_2$), and α=0, β=0.25

(iii) $A_1$ is Sr, $A_2$ is Ba, $0.03 \leq x_1 \leq 0.05$, $0.03 \leq x_2 \leq 0.05$ ($|x_1-x_2| \leq 0.01$), and α=0, β=0.

TABLE 10

|  |  | A1 | A2 | X1 | X2 | z/y | γ | Condition | Additive | Displacement |
|---|---|---|---|---|---|---|---|---|---|---|
| Example | 3 | La |  | 0.04 |  | 1.22 | 0.01 | (A) | 0.3 wt % | 29.6 μm |
|  | 5 | Sr | Ba |  | 0.04 |  |  | (C) | $Sb_2O_3$ | 29.4 μm |
|  | 31 | La |  |  |  |  | 0.05 | (A) |  | 25.2 μm |
|  | 32 | Sr | Ba |  | 0.04 |  |  | (C) |  | 26.1 μm |
| Comparative | 31 | La |  | 0.04 |  | 1.22 | 0 | (A) | 0.3 wt % | 23.1 μm |
| Example | 32 | La |  |  |  |  | 0.1 |  | $Sb_2O_3$ | 20.1 μm |
|  | 33 | Sr | Ba |  | 0.04 |  | 0 | (C) |  | 22.9 μm |
|  | 34 | Sr | Ba |  |  |  | 0.1 |  |  | 22.0 μm |

2. A piezoelectric material containing as a main component a composite oxide expressed by the general formula (2)

where $0.02 \leq x_1 < 0.08$, $0 \leq x_2 \leq 0.05$ ($0.02 \leq x_1+x_2 \leq 0.1$, $x_1 \geq x_2$), $y+z=1$, $1.15 < z/y < 1.30$, $0 < \gamma \leq 0.1$, and $\alpha=0, \beta=0.25$ or $\alpha=0.5, \beta=0$.

3. A piezoelectric material containing as a main component a composite oxide expressed by the general formula (3)

where $0.03 \leq x_1 \leq 0.05$, $0.03 \leq x_2 \leq 0.05$ ($|x_1-x_2| \leq 0.01$), $y+z=1$, $1.15 < z/y < 1.30$, and $0 < \gamma < 0.1$.

4. A piezoelectric material according to any one of claims 1 to 3, containing at least one of $Sb_2O_3$, $Mn_2O_3$ and $Nb_2O_5$ not more than 0.5 weight %.

5. A method of manufacturing a piezoelectric material containing as a main component a composite oxide expressed by the general formula (1)

where $y+z=1$, $1.15 < z/y < 1.30$, $0 < \gamma < 0.1$, and wherein the compound of each component element providing an initial material is prepared in such a manner that $A_1$, $A_2$, $x_1$, $x_2$ satisfy any of the following conditions, mixed, calcined, crushed, granulated and then baked:

(i) $A_1$ is at least selected from one of Ce and La,
$A_2$ is K, $0.02 \leq x_1 < 0.08$, $0 \leq x_2 \leq 0.05$
($0.02 \leq x_1+x_2 \leq 0.1$, $x_1 \geq x_2$), and
$\alpha=0.5$, $\beta=0$ (ii) $A_1$ is at least selected from one of Ce and La,
$A_2$ is K, $0.02 \leq x_1 < 0.08$, $0 \geq x_2 \leq 0.05$
($0.02 \leq x_1+x_2 \leq 0.1$, $x_1 \leq x_2$) and
$\alpha=0$, $\beta=0.25$

(iii) $A_1$ is Sr, $A_2$ is Ba,
$0.03 \leq x_1 \leq 0.05$, $0.03 \leq x_2 \leq 0.05$
($|x_1-x_2| \leq 0.01$), and
$\alpha=0$, $\beta=0$.

6. A method of manufacturing a piezoelectric material containing, as a main component, a composite oxide expressed by the general formula (2)

wherein the compound of each component element of an initial material is prepared in such a manner as to satisfy the following conditions, mixed, calcined, crushed, granulated and then baked:
$0.02 \leq x_1 \leq 0.08$, $0 \leq x_2 \leq 0.05$
($0.02 \leq x_1+x_2 \leq 0.1$, $x_1 \geq x_2$),
$y+z=1$, $1.15 < z/y < 1.30$,
$0 < \gamma < 0.1$, and
$\alpha=0$, $\beta=0.25$ or $\alpha=0.5$, $\beta=0$.

7. A method of manufacturing a piezoelectric material containing as a main component a composite oxide expressed by the general formula:

(3)

wherein the compound of each component element of an initial material is prepared in such a manner as to satisfy the following conditions, mixed, calcined, crushed, granulated and then baked:
where $0.03 \leq x_1 \leq 0.05$, $0.03 \leq x_2 \leq 0.05$
($|x_1-x_2| \leq 0.01$),
$y+z=1$, $1.15 < z/y < 1.30$, and
$0 < \gamma < 0.1$.

8. A method of manufacturing a piezoelectric material according to any one of claims 5 to 7,
wherein at least a selected one of the additives including $Sb_2O_3$, $Mn_2O_3$ and $Nb_2O_5$ is added to the prepared material in such a manner that the content of said selected additive in the resulting piezoelectric material is not more than 0.5 weight %.

* * * * *